United States Patent [19]

Steitz

[11] 3,719,981

[45] March 13, 1973

[54] METHOD OF JOINING SOLDER BALLS TO SOLDER BUMPS

[75] Inventor: Richard Ralph Steitz, Indianapolis, Ind.

[73] Assignee: RCA Corporation, New York, N.Y.

[22] Filed: Nov. 24, 1971

[21] Appl. No.: 201,783

[52] U.S. Cl. ......................29/423, 29/471.3, 29/491, 29/589

[51] Int. Cl. ..............................................B23p 17/00

[58] Field of Search..........29/471.1, 471.3, 475, 491, 29/589, 423, 628

[56] References Cited

UNITED STATES PATENTS

| | | | |
|---|---|---|---|
| 3,080,841 | 3/1963 | Nobel | 29/589 |
| 3,205,299 | 9/1965 | Dickie | 29/628 UX |
| 3,212,160 | 10/1965 | Dale et al. | 29/589 |
| 3,292,240 | 12/1966 | McNutt et al. | 29/589 |
| 3,392,442 | 7/1968 | Napier et al. | 29/417.3 X |
| 3,458,925 | 8/1969 | Napier et al. | 29/471.1 X |

*Primary Examiner*—J. Spencer Overholser
*Assistant Examiner*—Richard Bernard Lazarus
*Attorney*—Glenn H. Bruestle

[57] ABSTRACT

A semiconductor wafer is provided with a plurality of semiconductor device flip chips in regular array, each of the devices having a plurality of solder bumps regularly spaced a certain distance apart. An array of solder balls is formed on the tacky surface of a piece of pressure-sensitive tape, the balls being spaced like the solder bumps. The array of solder balls is placed in contact with the array of solder bumps both of which are then heated to reflow the solder and then cooled to fix the contact. The tape is then removed.

6 Claims, 10 Drawing Figures

METHOD OF JOINING SOLDER BALLS TO SOLDER BUMPS

BACKGROUND OF THE INVENTION

Hybrid integrated circuits usually have a pattern of conductors and resistors printed or vapor-deposited on an insulating substrate. Capacitors may either be formed in the same manner or manufactured separately as discrete components and mounted on terminals of the circuit pattern. Active units, such as transistors or monolithic integrated circuit portions, are always made separately and mounted on circuit terminals.

In order to manufacture hybrid circuits of these types at low cost, automatic positioning and machine placement of the separately manufactured circuit components is a necessity. In order to adapt discrete semiconductor devices, such as transistors or monolithic circuit portions for machine handling and placement, at least two different types of mounting means have been proposed. One of these is the so-called "beam lead" which is a thickened portion of a conductor on the semiconductor chip surface that extends out from an edge of the chip. The positions of the beam leads are detectable mechanically and the chip can be readily oriented for thermo-compression or solder bonding.

Although beam-lead type mounting has proved satisfactory and orientation of the devices is easily done, since the beam leads are deposited by vacuum evaporation, cost is somewhat higher than desired.

Another type of mounting means is the solder bump. In this type, raised solder bumps are formed for each mounting electrode on the chip. The chip is then turned over, the solder bumps are matched to solderable areas on the substrate conductor pattern - and the assembly is heated to reflow the solder. Although automatic orientation of the chips is not as easily done as in the beam lead method, the considerably less cost in making solder bumps compared to beam leads still makes this method attractive for low-cost manufacturing.

Besides the problem of orientation of the completed chip on the circuit terminals, another problem is present in making chips with solder bump type connections. A commonly used process of making the electrical connections on each chip comprises covering the surface of the chip with a thin glass protective coating, etching openings in the glass where connections are desired, depositing one or more layers of metal within the openings to provide good ohmic contact to the semiconductor and also to provide a surface to which solder will readily adhere, and then dipping in solder to provide solder bumps on the metallized areas. However, this results in low-profile solder bumps being formed. That is, the crest of the bump is only slightly higher than the periphery. By a "high profile" solder bump is meant one with a high degree of convexity. The center of the bump is considerably higher than the periphery. The low-profile type of solder bump is not suitable for mounting the chip on circuit terminals. The chip must be raised a certain distance above the substrate surface to provide room for clean-up etching and to enable the surface tension of solder to align the chip precisely as solder wets the circuit terminals.

It has previously been found that if a solder ball is joined to each low-profile solder bump, the chip can then be satisfactorily mounted on the substrate terminals. But a problem has existed as to how to place these solder balls centrally on each solder bump by a low-cost mechanical method.

SUMMARY OF THE INVENTION

The process comprises providing a transparent, flexible substrate having a tacky, pressure-sensitive surface, forming on the tacky surface an array of solder balls spaced like the solder bumps, aligning the array of solder balls with the array of solder bumps and placing the array of balls in contact with the array of bumps, heating to re-flow the solder, and separating the tacky surface from the solder balls.

THE DRAWINGS

DESCRIPTION OF PREFERRED EMBODIMENT

Figure 5:
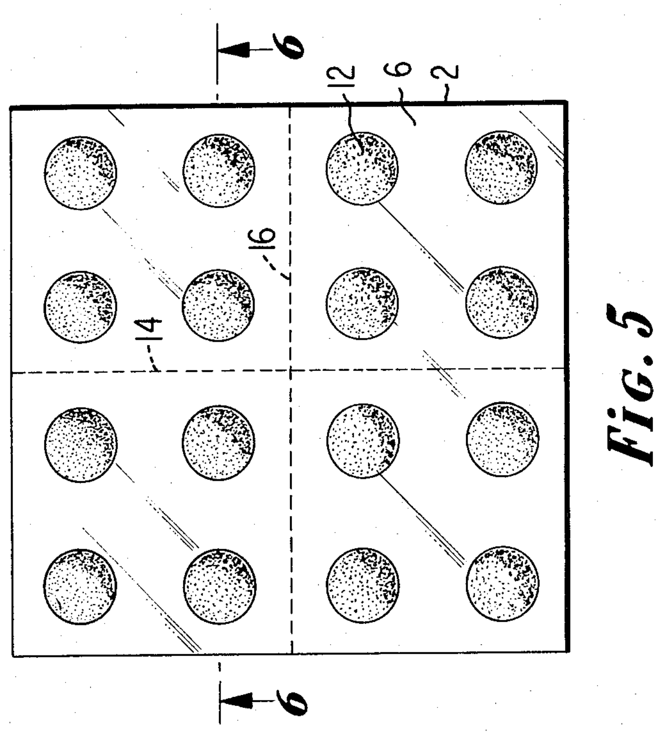
FIG. 5 is a plan view of part of a larger array of semiconductor devices in a semiconductor wafer with low-aspect-ratio solder bumps on the device electrode.
Figure 6:
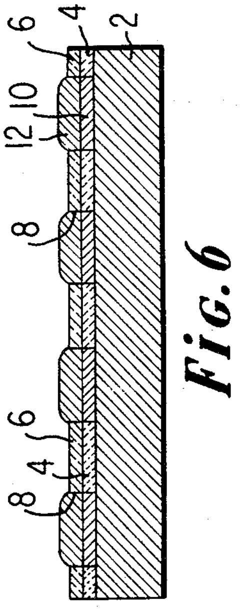
FIG. 6 is a partial cross-section view taken along the line 6—6 of FIG. 5.

Part of a large array of devices to which the method of the present invention may be applied is illustrated in FIGS. 5 and 6. The partial array includes a semiconductor wafer 2 having fabricated therein 4 transistors the internal structural details of which are not shown because that is immaterial to the present invention.

The top surface of wafer 2 is covered with a passivating layer 4 which may be silicon dioxide, for example, and on top of the oxide layer 4 is a thin glass protective layer 6. There are openings 8 in the layers 4 and 6 wherever there are ohmic connections to the transistors. These ohmic connections comprise a thin layer of metal 10 which may actually be a composite layer of aluminum on the surface of wafer 2 and a layer of zinc on the aluminum which is for the purpose of providing for better adherence of a layer of solder 12 on top of the metal layer 10. The solder layer 12 has a slightly curved top surface constituting a low-profile solder bump. Each transistor has 4 of the solder bump connections 12. Dotted lines 14 and 16 indicate where saw cuts will later be made in dividing the wafer 2 into individual devices.

Figure 1:
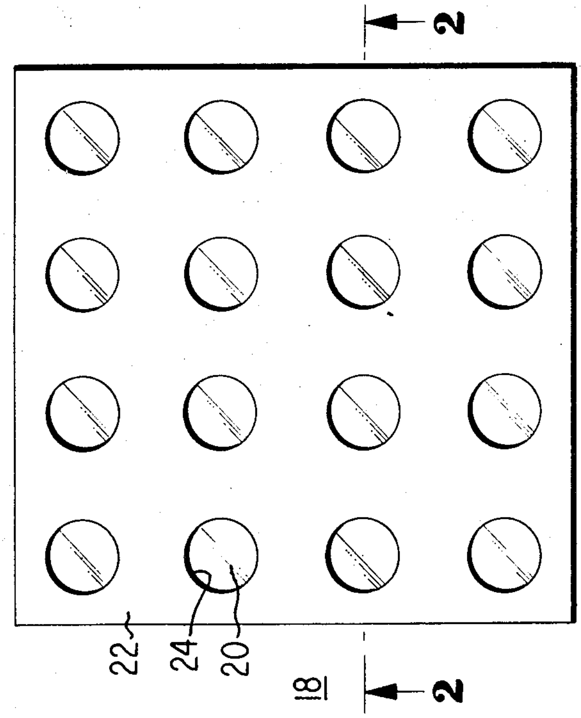
FIG. 1 is a plan view of part of a larger piece of transparent, pressure-sensitive tape with a mask or jig having a regular array of openings, disposed on the tacky surface of the tape.
Figure 2:
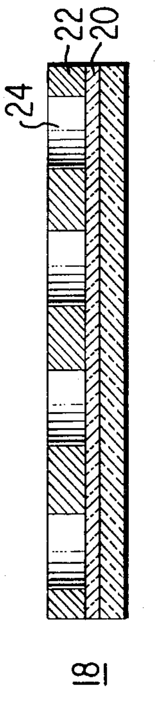
FIG. 2 is a cross-section view taken along the line 2—2 of FIG. 1.

In carrying out the method of the invention, there is provided a wide piece of pressure sensitive tape 18 (FIGS. 1 and 2) having a tacky surface 20. The tape may be a conventional commercial type such as "-Scotch" brand, for example. On top of the tacky surface 20 is placed a metal mask 22 having an array of openings 24 spaced the same as the solder bumps 12 on semiconductor wafer 2. The openings 24 are about the same size as solder bumps 12.

Figure 3:
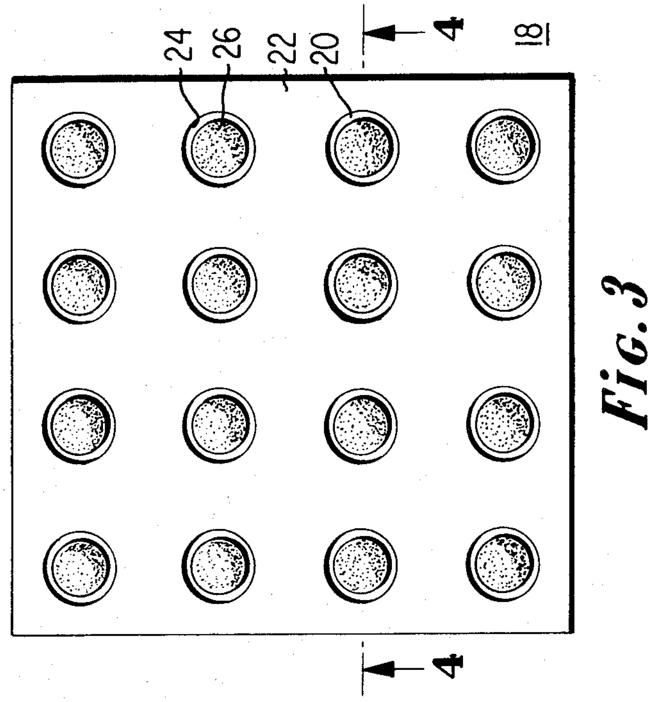
FIG. 3 is a plan view like that of FIG. 1 with a solder ball within each opening of the mask and adhered to the tacky surface of the tape.
Figure 4:
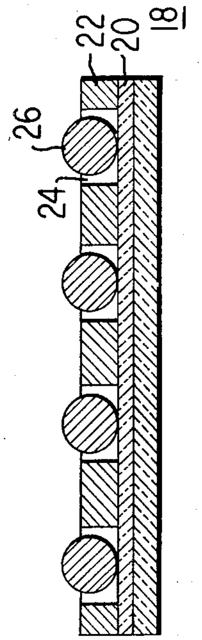
FIG. 4 is a cross-section view taken along the line 4—4 of FIG. 3.

Next, a solder ball 26 (FIGS. 3 and 4) slightly less in diameter than opening 24 is placed within each opening 24 in mask 22 so that the solder balls stick to the tacky surface 20. This operation may be quickly performed by cascading a large number of the tiny solder balls across the surface of the mask 22 and pouring off the excess. One ball falls into each mask opening.

Figure 7:
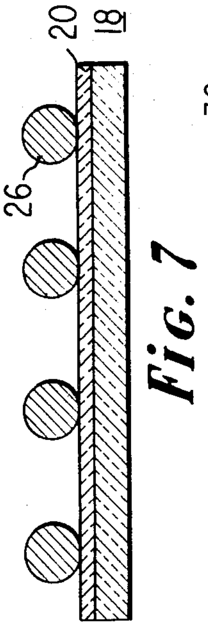
FIG. 7 is a cross-section view like that of FIG. 4 showing the mask removed from the assembly.

The mask 22 is then carefully separated from the tacky surface 20 (FIG. 7) leaving an array of solder balls 26 adhered to the surface 20. The solder balls are now spaced like the solder bumps 12.

Figure 8:
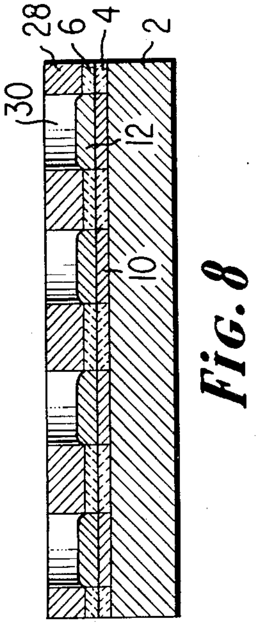
FIG. 8 is a cross-section view like that of FIG. 6 with a mask added.
Figure 9:
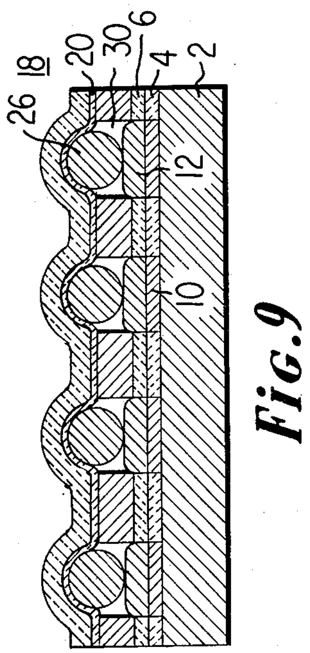
FIG. 9 is a cross-section view showing the assemblies of FIGS. 7 and 8 in face-to-face contact.

To apply the solder balls 26 to the solder bumps 12, a second mask 28 (FIG. 8) having openings 30 spaced like those of the first mask 22 is placed over the semiconductor wafer 2 so that each opening 30 corresponds to a solder bump 12. The piece of pressure sensitive tape 18 with the array of solder balls 26 adhered thereto is then inverted and placed over the mask 28 (FIG. 9) so that each solder ball 26 is disposed within an opening 30 in mask 28 and contacts one of the solder bumps 12. Since the tape 18 is transparent, alignment can be made visually by placing the assembly on top of a light table.

Figure 10:
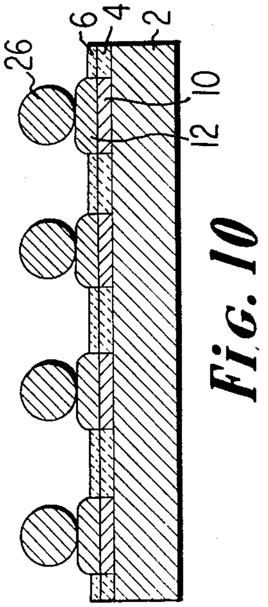
FIG. 10 is a cross-section view showing a final stage in the process of the invention.

Then the assembly is heated to a temperature just sufficient to start to reflow the solder in bumps 12 and balls 26 so that the two will be permanently joined, and, after cooling, the tape 18 is separated from the balls 26 leaving a completed array of devices (FIG. 10) with solder balls attached to each electrode position.

Later, when the wafer is cut up along the lines 14 and 16 either by sawing or etching, for example, each transistor can be mounted in a circuit (not shown) by inverting the chip and placing the solder balls in contact with solder-wettable terminals and heating to melt the solder.

I claim:

1. A method of applying solder balls to low-profile solder bumps contact areas of semiconductor device flip chips to be mounted on hybrid integrated circuits comprising:

providing a semiconductor wafer having a plurality of semiconductor devices in regular array, each of said devices having a plurality of said solder bumps regularly spaced a certain distance apart, forming an array of solder balls on the tacky surface of a piece of pressure-sensitive tape, said balls being spaced like said solder bumps, placing said array of solder balls in matched alignment and in contact with said solder bumps, heating to reflow the solder and thereby join said bumps with said balls, and removing said tape from said solder balls.

2. A method according to claim 1 in which said tacky surface is covered with a first mask having an array of openings therein spaced like said solder bumps and a solder ball is placed within each of said openings.

3. A method according to claim 2 in which a large number of solder balls are cascaded across said first mask openings so that a solder ball drops into each opening and excess balls are poured away, and then said first mask is removed to form said array of balls.

4. A method according to claim 3 in which a second mask is placed over said wafer with openings aligned with said solder bumps, said array of solder balls is aligned with said openings of said second mask, said solder balls are placed in contact with said solder bumps and the assembly is heated to re-flow said solder.

5. A method of applying solder balls to low-profile solder bumps contact areas of semiconductor device flip chips to be mounted on hybrid integrated circuits comprising:

providing a semiconductor wafer having a plurality of semiconductor devices in regular array, each of said devices having a plurality of said solder bumps regularly spaced a certain distance apart, providing a transparent, flexible substrate having a tacky, pressure-sensitive surface, placing on said surface a first metal mask having an array of holes (i) spaced similarly to said solder bumps on said wafer, and (ii) having a diameter approximately the same as said solder balls, placing one of said solder balls within each of said holes such that said balls adhere to said tacky surface, separating said first mask from said substrate whereby said substrate has an array of said solder balls spaced like said solder bumps, placing over said wafer a second metal mask with an array of holes spaced like those of said first metal mask and aligned such that the holes thereof are matched to said solder bumps, applying said array of solder balls face down over said second mask such that each of said solder balls touches one of said solder bumps, heating the assembly just hot enough to reflow the solder in said bumps and balls and attach the two together forming high profile solder bumps, and, after cooling, removing said second mask and said tacky material on said substrate from said wafer and said high profile solder bumps.

6. A method of joining solder balls to low-profile solder bumps on a substrate, comprising:

providing a substrate with a regular array of spaced low-profile solder bumps, forming an array of said solder balls on the tacky surface of a piece of pressure-sensitive tape, said balls being spaced like said solder bumps, aligning said array of solder balls with said array of solder bumps such that said balls contact said bumps, heating to re-flow said solder, and, after cooling, removing said tape from said solder balls.

* * * * *